United States Patent
Matsuoka

(10) Patent No.: US 10,074,413 B2
(45) Date of Patent: Sep. 11, 2018

(54) SEMICONDUCTOR STORAGE DEVICE

(71) Applicant: TOSHIBA MEMORY CORPORATION, Minato-ku, Tokyo (JP)

(72) Inventor: Fumiyoshi Matsuoka, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/264,545

(22) Filed: Sep. 13, 2016

(65) Prior Publication Data

US 2017/0270987 A1   Sep. 21, 2017

Related U.S. Application Data

(60) Provisional application No. 62/309,837, filed on Mar. 17, 2016.

(51) Int. Cl.
*G11C 11/00* (2006.01)
*G11C 11/16* (2006.01)
*G11C 13/00* (2006.01)

(52) U.S. Cl.
CPC ...... *G11C 11/1675* (2013.01); *G11C 11/1693* (2013.01); *G11C 13/0004* (2013.01); *G11C 13/0061* (2013.01); *G11C 13/0069* (2013.01)

(58) Field of Classification Search
CPC ..... G11C 11/4076; G11C 7/22; G11C 7/1072; G11C 11/1673; G11C 11/1675
See application file for complete search history.

(56) References Cited

U.S. PATENT DOCUMENTS

| | | | |
|---|---|---|---|
| 8,947,918 B2 | 2/2015 | Fujita | |
| 2002/0021591 A1 | 2/2002 | Yabe et al. | |
| 2005/0207229 A1 | 9/2005 | Takeuchi | |
| 2010/0110813 A1* | 5/2010 | Wilson | G11C 7/1078 365/203 |
| 2015/0302907 A1* | 10/2015 | Hadrick | G11C 7/22 365/189.05 |
| 2017/0097904 A1* | 4/2017 | Ware | G06F 13/1673 |

FOREIGN PATENT DOCUMENTS

JP          08255107 A       10/1996

* cited by examiner

*Primary Examiner* — Uyen B Tran
(74) *Attorney, Agent, or Firm* — Holtz, Holtz & Volek PC

(57) ABSTRACT

According to one embodiment, a semiconductor storage device includes: a first bank that includes a first memory cell group and writes data into the first memory cell group upon receipt of a first command; a second bank that includes a second memory cell group and writes data into the second memory cell group upon receipt of the first command; and a delay controller that issues the first command for the first bank upon receipt of a second command, and issues the first command for the second bank after an interval of at least a first period.

6 Claims, 19 Drawing Sheets

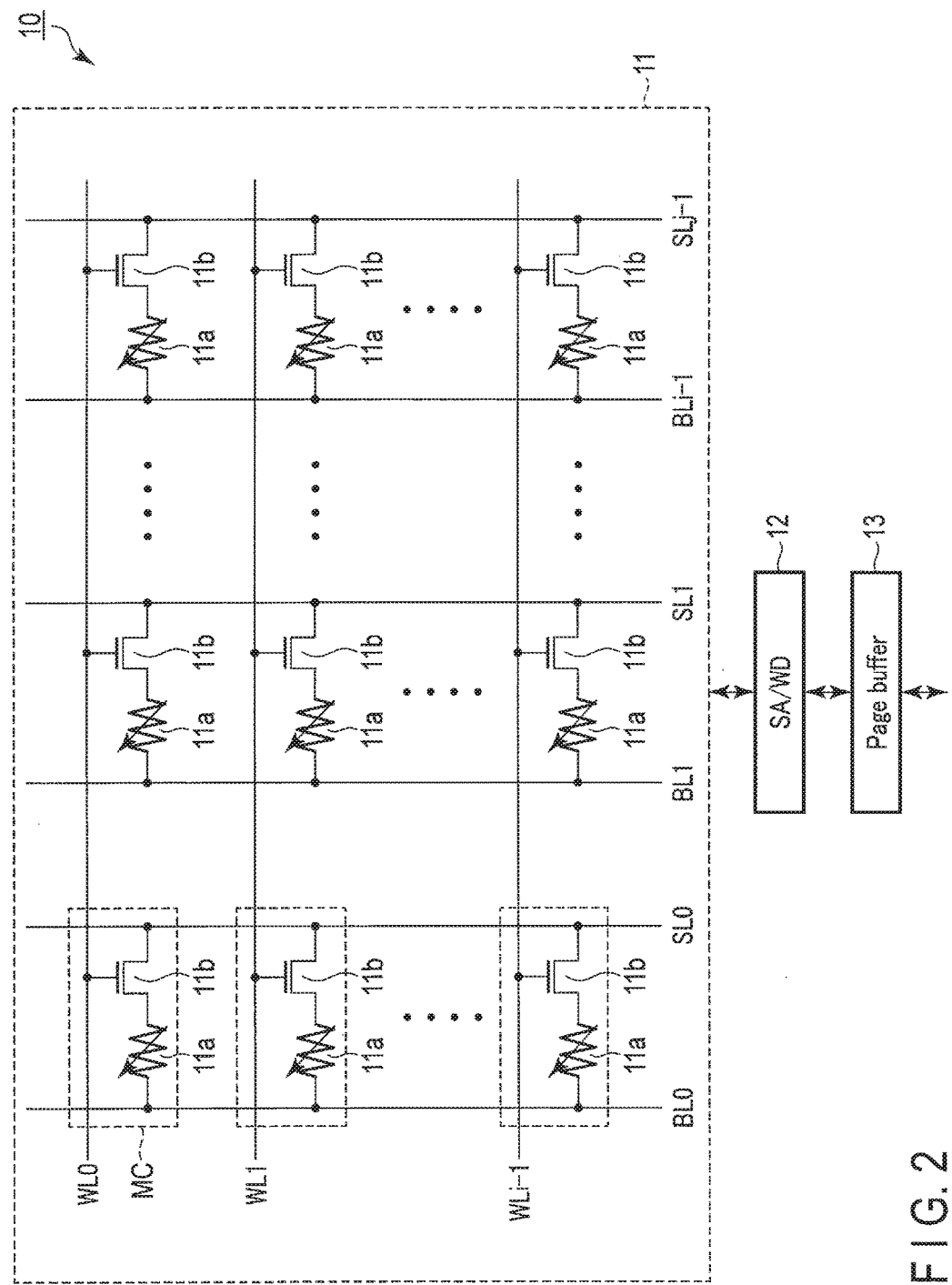
F I G. 2

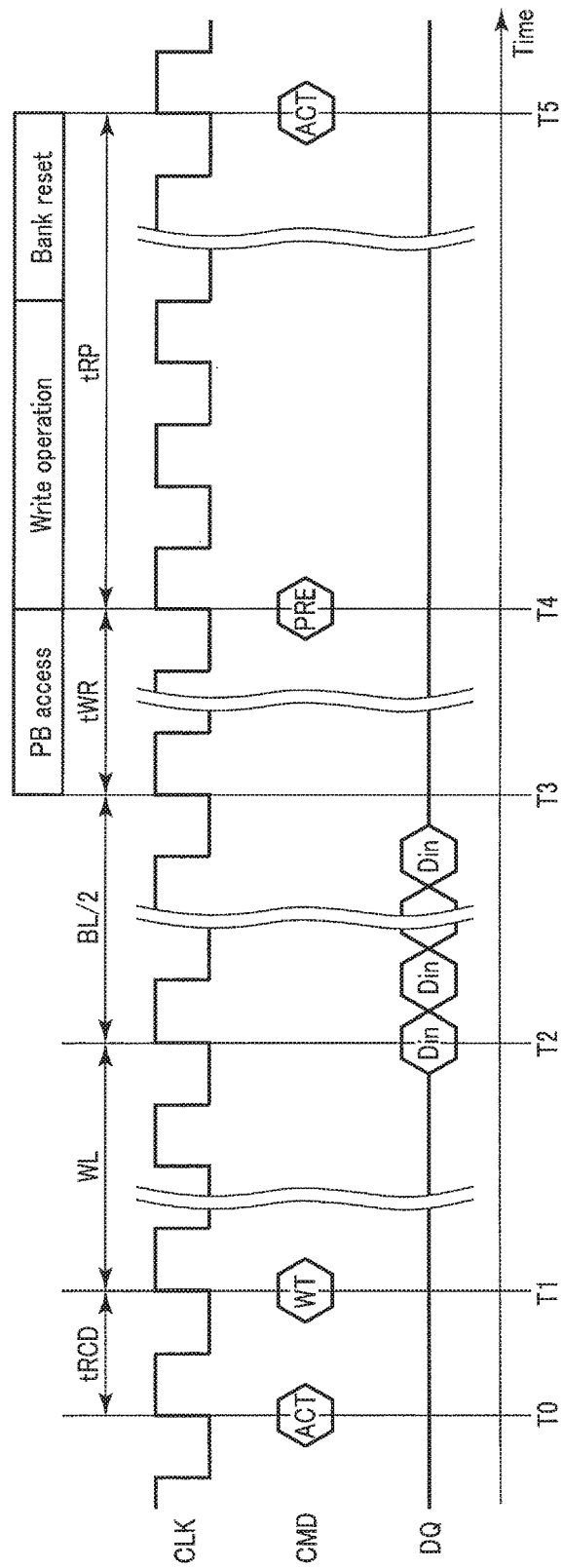
F I G. 5

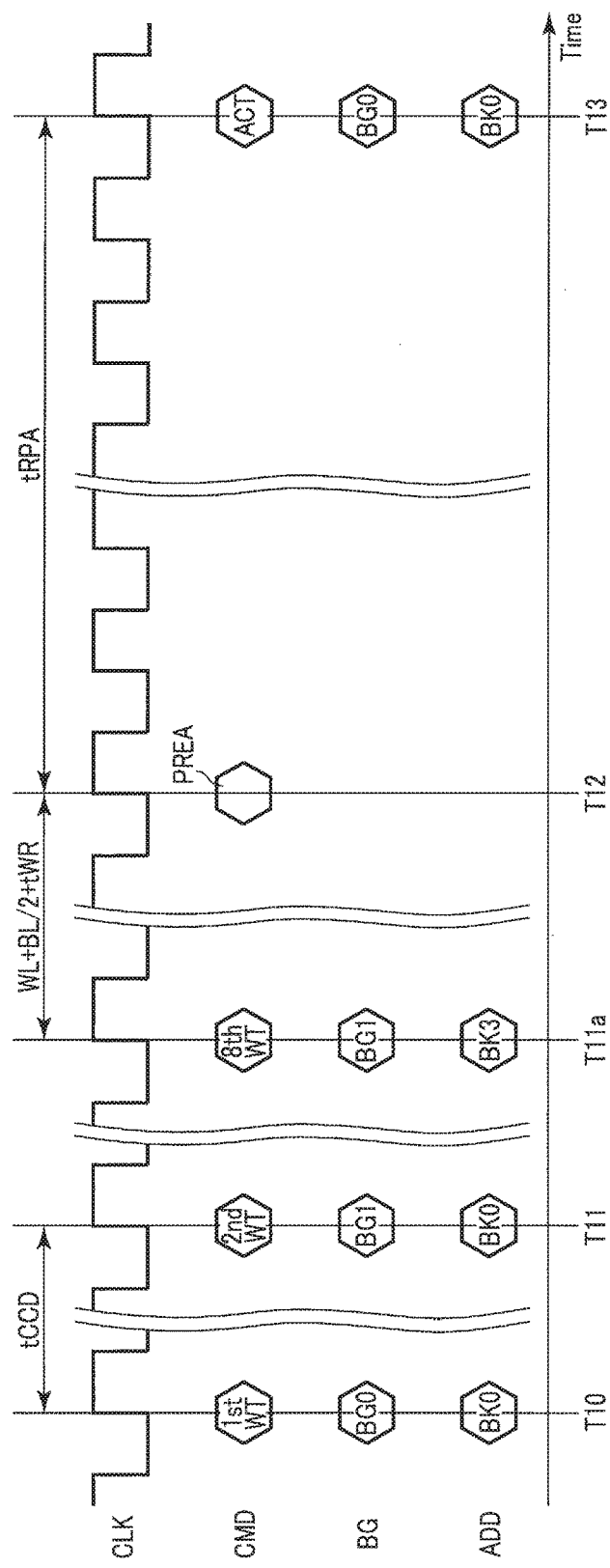
F I G. 6

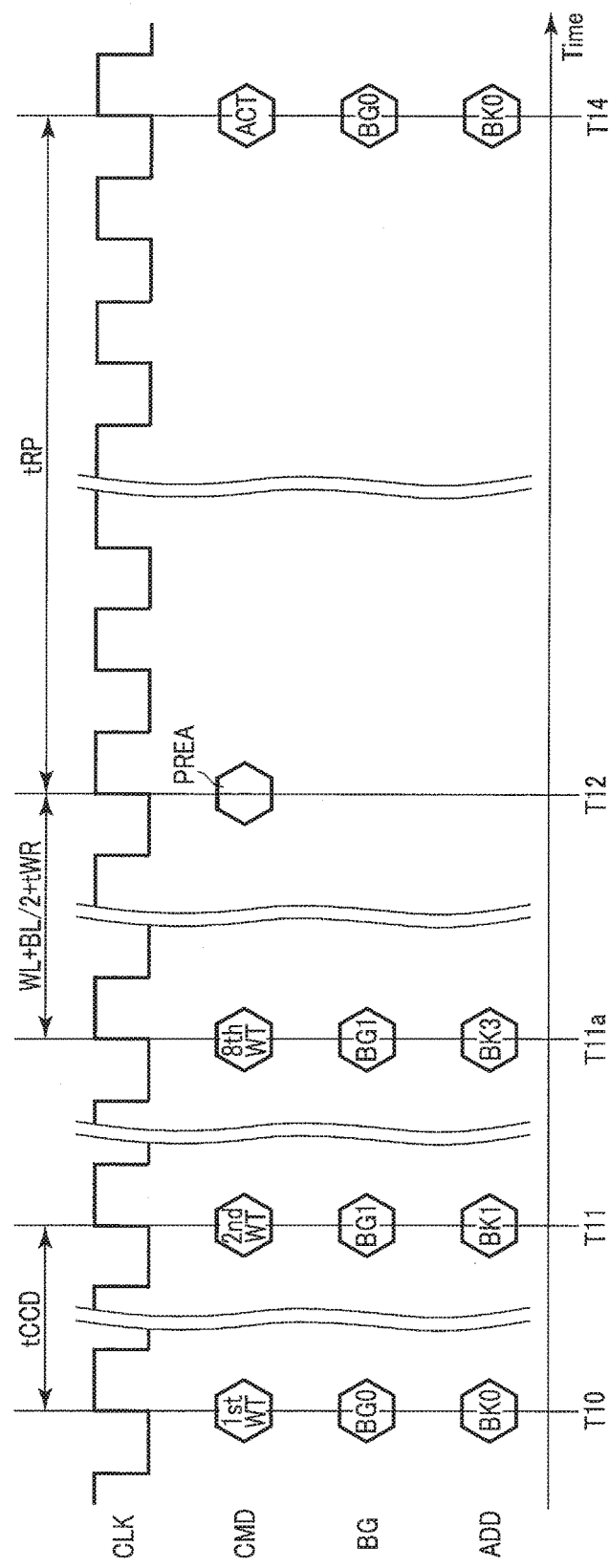
F I G. 8

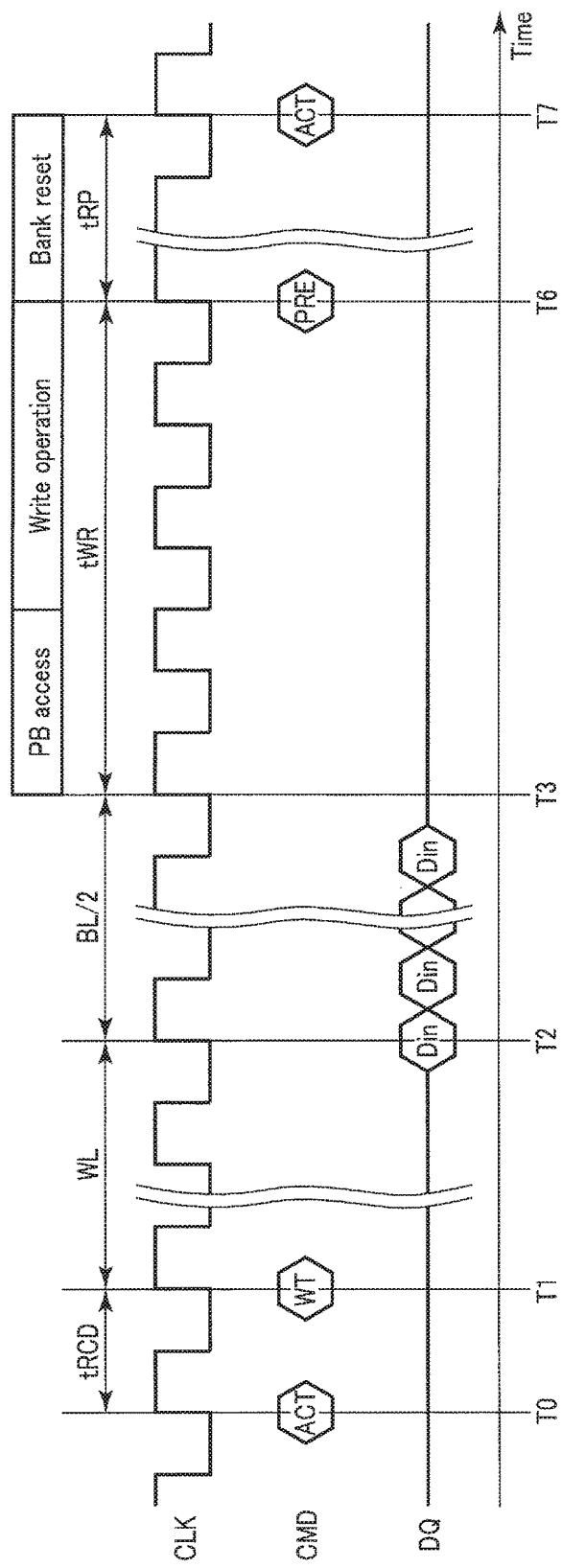
F I G. 12

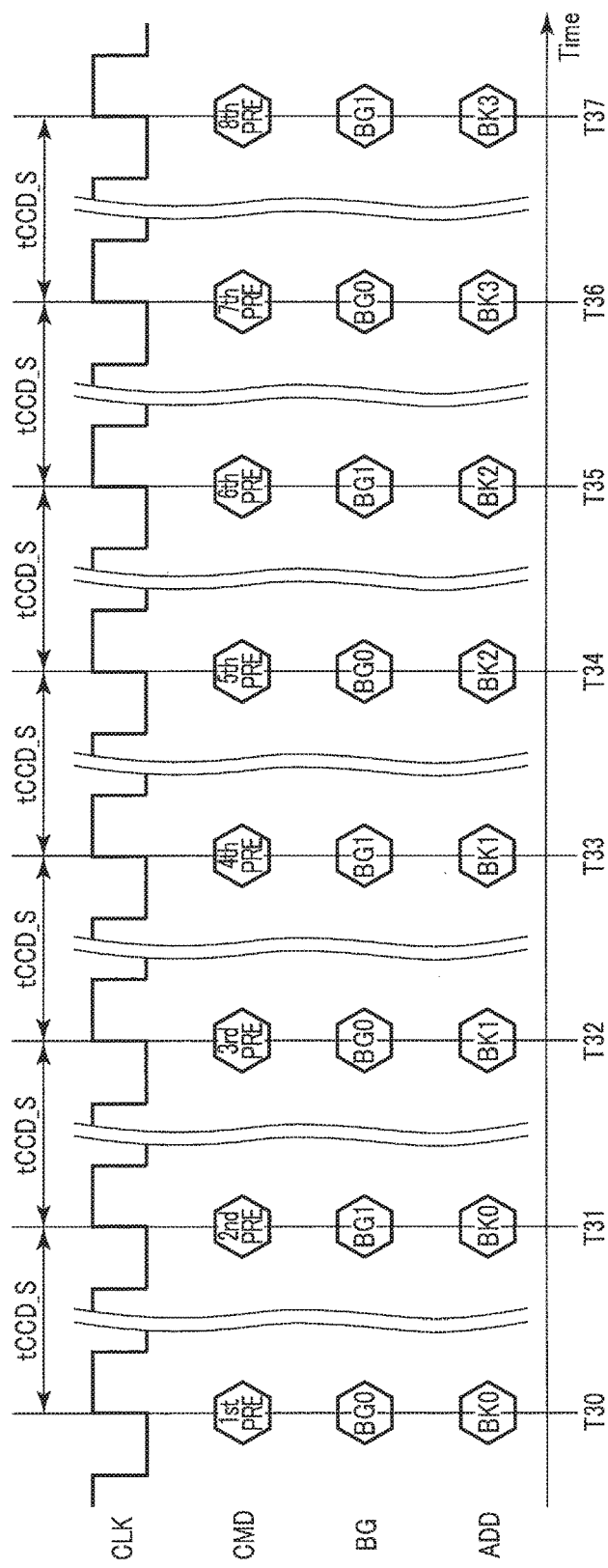
F I G. 13

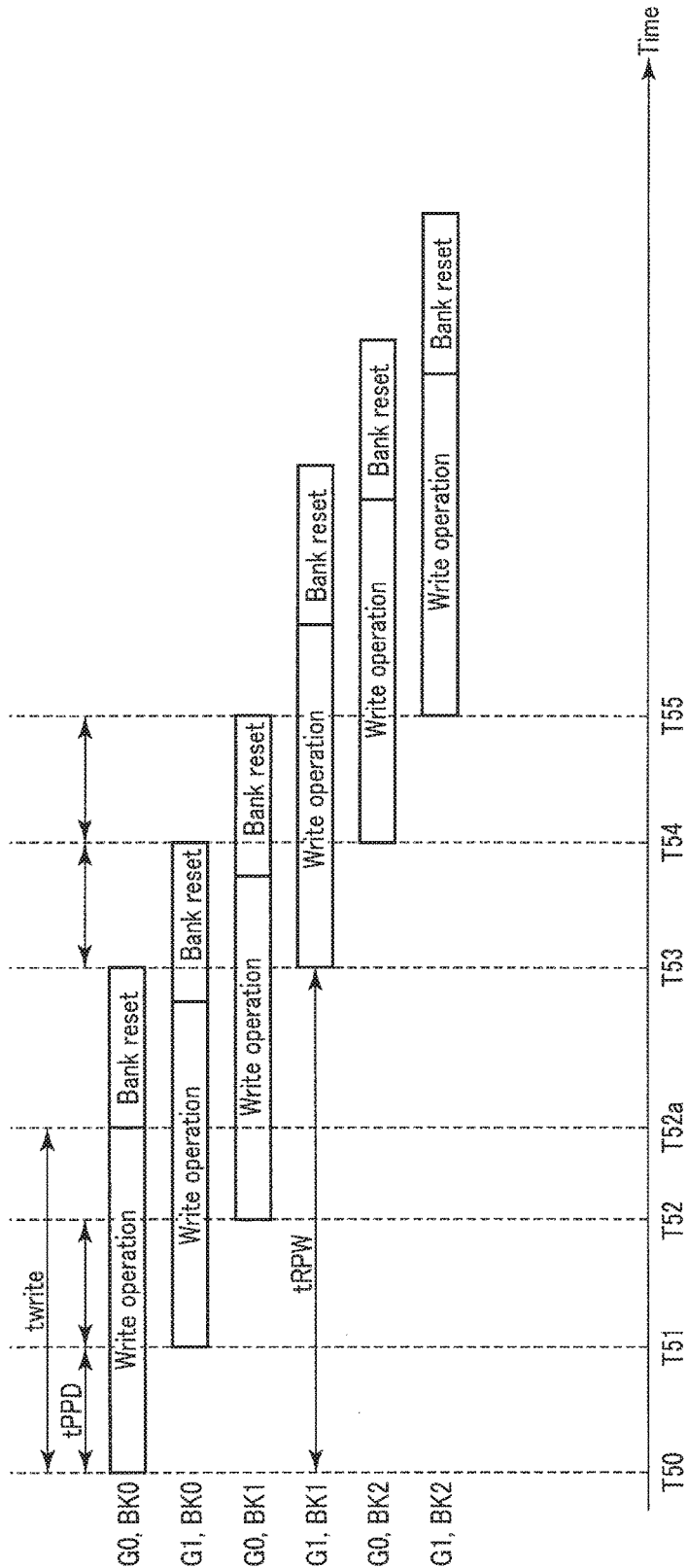
F I G. 16

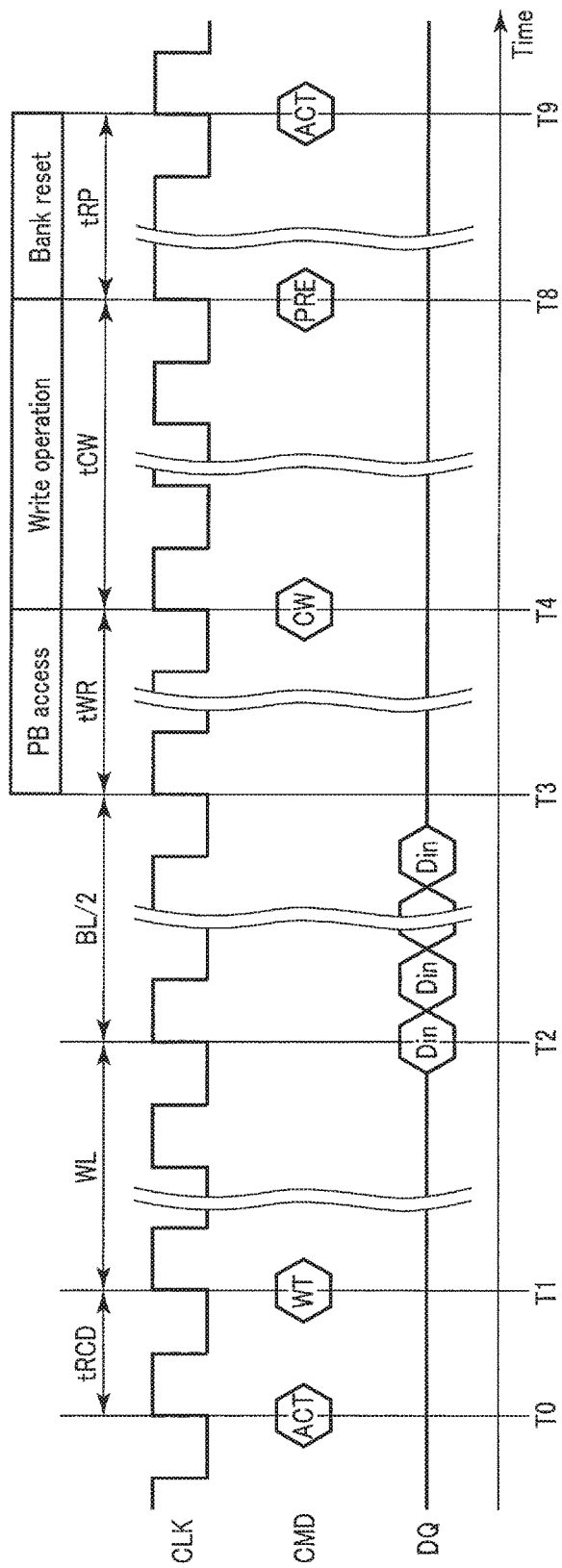
F I G. 17

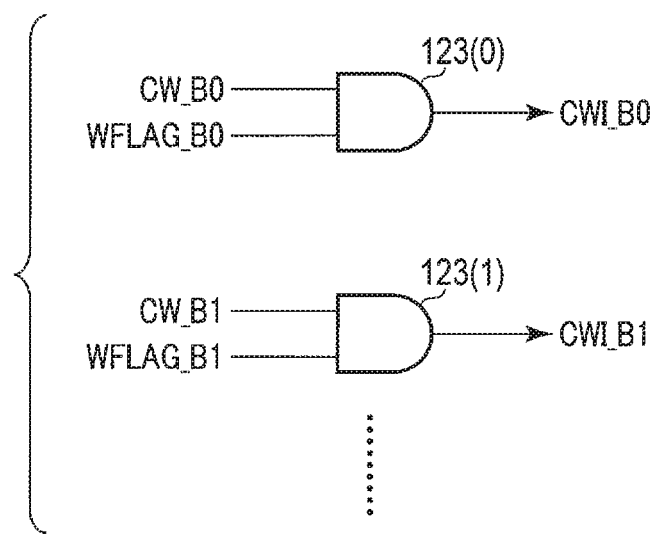
F I G. 18

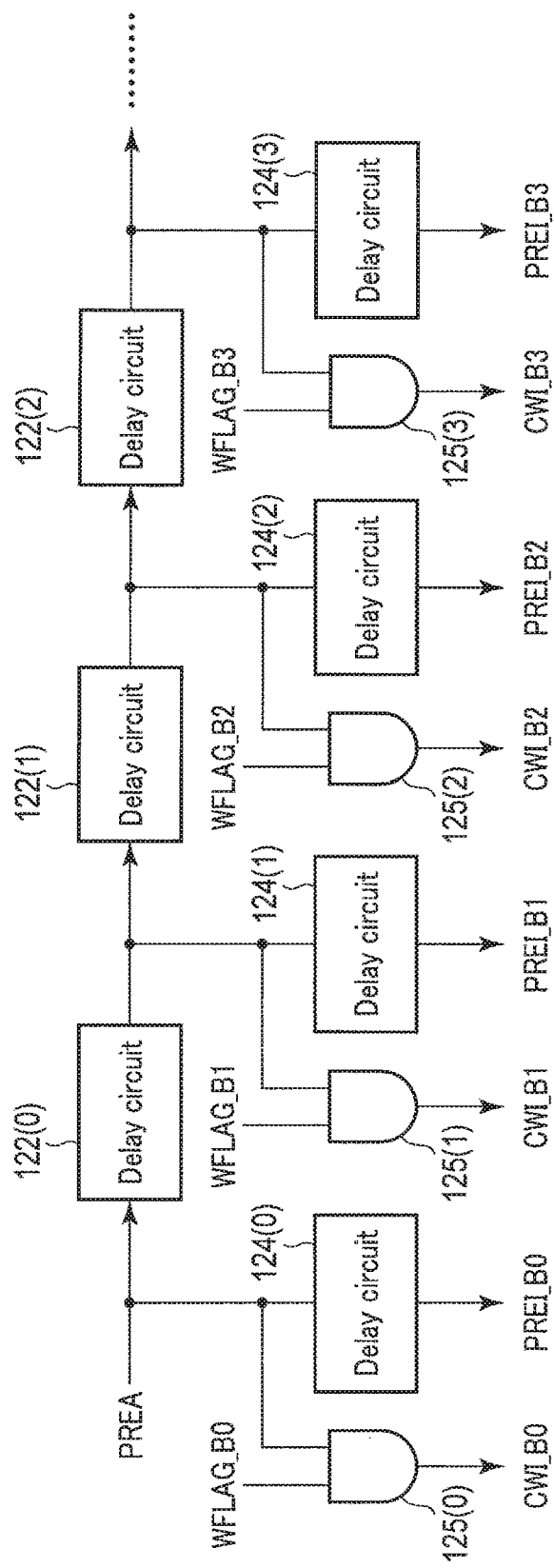
F I G. 19

SEMICONDUCTOR STORAGE DEVICE

CROSS-REFERENCE TO RELATED APPLICATIONS

This application claims the benefit of U.S. Provisional Application No. 62/309,837, filed Mar. 17, 2016, the entire contents of which are incorporated herein by reference.

FIELD

Embodiments described herein relate generally to a semiconductor storage device.

BACKGROUND

A magnetic random access memory (MRAM) is a memory device employing a magnetic element having a magnetoresistive effect as a memory cell for storing information, and is receiving attention as a next-generation memory device characterized by its high-speed operation, large storage capacity, and non-volatility. Research and development have been advanced to use the MRAM as a replacement for a volatile memory, such as a dynamic random access memory (DRAM) or a static random access memory (SRAM). In order to lower the development cost and enable smooth replacement, it is desirable to operate the MRAM on the same specifications as the DRAM and SRAM.

BRIEF DESCRIPTION OF THE DRAWINGS

FIG. 2 shows a bank of the memory system according to the first embodiment.

FIG. 5 is a command sequence showing a write operation of the memory system according to the first embodiment.

FIG. 6 is a command sequence showing a specific example of the write operation of the memory system according to the first embodiment.

FIG. 8 is a command sequence showing a specific example of a write operation of a memory system according to a comparative example of the first embodiment.

FIG. 12 is a command sequence showing a write operation of a memory system according to a comparative example of the second embodiment.

FIG. 13 is a command sequence showing a specific example of the write operation of the memory system according to the comparative example of the second embodiment.

FIG. 16 shows an operation relating to FIG. 15 of a semiconductor storage device of the memory system according to the third embodiment.

FIG. 17 is a command sequence showing a write operation of a memory system according to the fourth embodiment.

FIG. 18 shows an internal controller according to a modification of the fourth embodiment.

FIG. 19 shows a delay controller of a semiconductor storage device according to the fifth embodiment.

DETAILED DESCRIPTION

In general, according to one embodiment, a semiconductor storage device includes: a first bank that includes a first memory cell group and writes data into the first memory cell group upon receipt of a first command; a second bank that includes a second memory cell group and writes data into the second memory cell group upon receipt of the first command; and a delay controller that issues the first command for the first bank upon receipt of a second command, and issues the first command for the second bank after an interval of at least a first period.

Hereinafter, embodiments will be described with reference to the drawings. In the following explanation, structural elements having substantially the same function and configuration will be assigned with the same reference symbol. Each of the embodiments described below merely indicates an exemplary apparatus or method for implementing the technical idea of the embodiment. The element materials, shapes, structures, arrangements, etc. of the technical ideas of the embodiments are not limited to the ones described below. The technical ideals of the embodiments may be varied within the range of the claims.

The following explanation will be provided based on the double data rate (DDR) 4 standard, as an example. However, the standard applied to the following embodiments is not limited to the DDR4 standard. The present embodiment may be based on the JEDEC memory standard, such as LPDDR and DDR, and may be applied to a memory based on no specific standard.

<1> First Embodiment

<1-1> Configuration

<1-1-1> Configuration of Memory System

Figure 1:
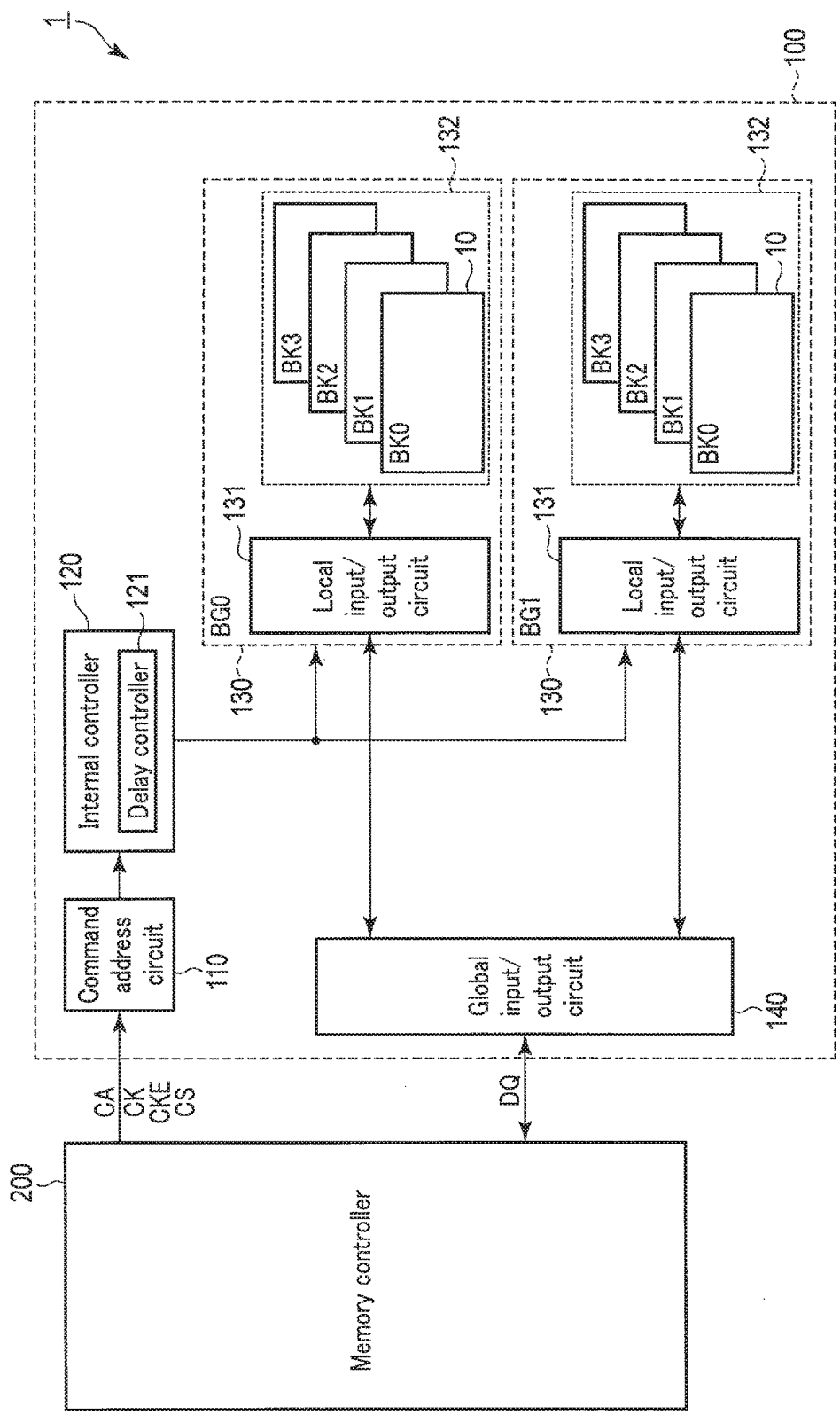
FIG. 1 is a block diagram showing a configuration of a memory system according to the first embodiment.

First, a memory system 1 according to an embodiment will be described. As shown in FIG. 1, the memory system 1 includes a semiconductor storage device 100, and a memory controller (or host device) 200. The semiconductor storage device 100 of the present embodiment is, for example, a spin transfer torque-type magnetoresistive random access memory (STT-MRAM).

As shown in FIG. 1, the semiconductor storage device 100 includes a command address circuit 110, an internal controller 120, a plurality of bank groups 130, and a global input/output circuit 140. For simplification, the case where the semiconductor storage device 100 includes two bank groups 130 (BG0) and (BG1) is described in the present embodiment. However, the semiconductor storage device 100 may include three or more bank groups 130. When bank group 130 (BG0) is not distinguished from bank group 130 (BG1), they will be merely referred to as "bank group 130". As mentioned above, the standard applied to the present embodiment is not limited to the DDR4 standard. Therefore, the bank group is not indispensable for the semiconductor storage device 100.

The command address input circuit 110 receives various external control signals, such as a command address signal CA, a clock signal CLK, a clock enable signal CKE, and a chip select signal CS, from the memory controller 200. The command address input circuit 110 transfers the received signals to the internal controller 120.

The internal controller 120 includes a delay controller 121. The delay controller 121 delays a command based on the received command address signal CA.

The global input/output circuit 140 controls the connection between the memory controller 200 and each bank group 130. The global input/output circuit 140 transmits data from the memory controller 200 to a predetermined bank group 130 based on instructions from the internal controller 120. The global input/output circuit 140 transmits data from a predetermined bank group 130 to the memory controller 200 based on instructions from the internal controller 120.

Bank group 130 (BG0) and bank group 130 (BG1) each include a plurality of banks 10.

The bank group 130 includes a local input/output circuit 131 and a memory area 132.

The memory area 132 includes a plurality of banks 10. For simplification, described herein is the case where the memory area 132 includes four banks 10 (BK0)-(BK3). However, the number of banks 10 is not limited to this. The details of the bank 10 will be described later. When banks 10 (BK0)-(BK3) are not distinguished from one another, they will be merely referred to as "bank 10".

<1-1-2> Bank

Next, the bank 10 of the memory area 132 will be described with reference to FIG. 2. The bank 10 includes a memory cell array 11, a sense amplifier/write driver (SA/WD) 12, and a page buffer 13.

The memory cell array 11 includes a matrix of a plurality of memory cells MC. In the memory cell array 11, a plurality of word lines WL0 to WLi−1, a plurality of bit lines BL0 to BLj−1, and a plurality of source lines SL0 to SLj−1 are arranged. One row of the memory cell array 11 is connected to one word line WL, and one column of the memory cell array 11 is connected to one pair formed by one bit line BL and one source line SL.

Each memory cell MC includes a magnetoresistive effect element (magnetic tunnel function (MTJ) element) 11a and a selection transistor 11b. The selection transistor 11b is formed by an N-channel MOSFET, for example.

One end of the MTJ element 11a is connected to a bit line BL, and the other end thereof is connected to the drain (source) of the selection transistor 11b.

The gate of the selection transistor 11b is connected to a word line WL, and the source (drain) thereof is connected to a source line SL.

The sense amplifier/write driver 12 is arranged at a bit line extension position of the memory cell array 11.

The sense amplifier/write driver 12 includes a sense amplifier and a write driver. The sense amplifier is connected to the bit lines BL, and detects a current flowing through a memory cell MC connected to a selected word line WL to read data stored in the memory cell MC. The write driver is connected to the bit lines BL and source lines SL, and supplies a current to a memory cell MC connected to a selected word line WL to write data in the memory cell MC.

The sense amplifier/write driver 12 controls the bit lines BL and the source lines SL based on control signals from the internal controller 120. Data exchange between the sense amplifier/write driver 12 and the data line DQ is performed via the page buffer 13.

The page buffer 13 temporarily holds data read from the memory cell array 11 or write data received from the memory controller 200. Write data is stored in the page buffer 13 in column address units (CA units). The write operation to the memory cell array 11 and the data read operation to the page buffer 13 are performed in page units. Data is output from the page buffer 13 to the data line DQ in CA units. The unit in which data is collectively read from the memory cell array 11 to the page buffer, or the unit in which data is collectively written from the page buffer in the memory cell array 11 are called a "page". The page buffer 13 according to the present embodiment is provided for each column address.

When data is written in the memory cell array 11, the memory controller 200 transmits, to the semiconductor storage device 100, a column address indicating where to write and write data together with a write command. The internal controller 120 stores write data received from the memory controller 200 in the page buffer 13, and writes the write data stored in the page buffer 13 in the memory cell MC designated by the column address.

When data is read from the memory cell array 11, the memory controller 200 transmits, to the semiconductor storage device 100, a column address indicating from where to read together with a read command. The internal controller 120 reads data from all the column addresses in the page to the page buffer 13.

The aforementioned bank configuration is an example, and the bank may have another configuration.

<1-1-3> Configuration of Memory Cell MC

Figure 3:
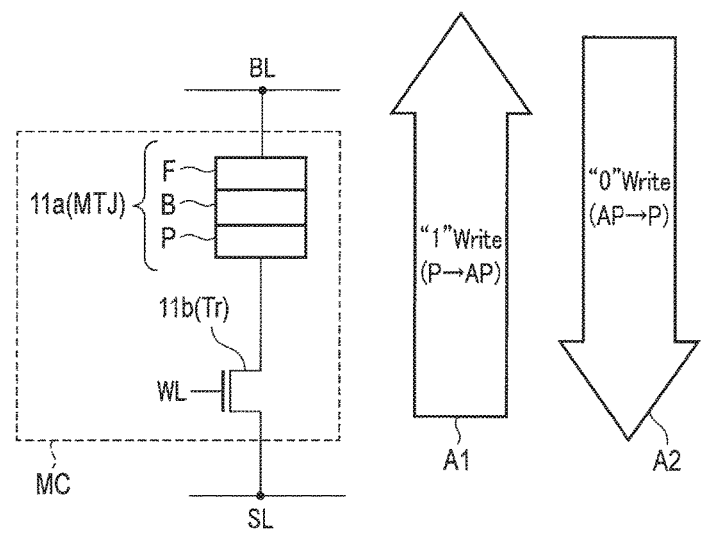
FIG. 3 shows a memory cell of the memory system according to the first embodiment.

Next, a schematic description of a configuration of the memory cell MC according to the first embodiment will be given with reference to FIG. 3. As shown in FIG. 3, one end of a magnetic tunnel junction (MTJ) element 11a of the memory cell MC of the first embodiment is connected to a bit line BL, and the other end thereof is connected to one end of a cell transistor 11b. The other end of the cell transistor 11b is connected to a source line SL. The MTJ element 11a utilizing a tunneling magnetoresistive (TMR) effect has a laminated structure of two ferromagnetic layers F and P and a non-magnetic layer (tunnel insulation film) B interposed therebetween, and stores data by utilizing changes in the magnetic resistance caused by a spin-polarized tunneling effect. The MTJ element 11a can go into a low-resistance state or a high-resistance state in accordance with magnetic orientations of the two ferromagnetic layers F and P. For example, if the low-resistance state is defined as data "0" and the high-resistance state is defined as data "1", 1-bit data can be stored in the MTJ element 11a. Of course the low-resistance state may be defined as data "1", and the high-resistance state may be defined as data "0".

The MTJ element 11a is formed, for example, by sequentially stacking a fixed layer (pin layer) P, a tunnel barrier layer B, and a storage layer (free layer) F. The pin layer P is formed by a ferromagnetic body, and contains, for example, cobalt platinum (CoPt), cobalt nickel (CoNi), or cobalt palladium (CoPd). The tunnel barrier layer B is formed by an insulation film (such as MgO). The free layer F is formed by a ferromagnetic body, and contains, for example, cobalt iron boron (CoFeB) or iron boride (FeB). The pin layer P is a layer of which the magnetic orientation is fixed, while the free layer F is a layer of which the magnetic orientation is variable and which stores data by utilizing the magnetic orientation.

The notations of materials, such as CoFeB, FeB, CoPt, CoNi, CoPd, and MgO, do not limit the composition ratios of those materials to 1:1:1 or 1:1. For example, when the recording layer contains CoFeB, the free layer F contains Co, Fe, and B (the composition ratio of Co, Fe, and B is not limited), and when the tunnel barrier layer B contains MgO, the tunnel barrier layer B contains Mg and O (the composition ratio of Mg and O is not limited). The same applies to the materials other than the above.

When a current flows in the direction of arrow A1 in a write operation, the magnetic orientation of the free layer F becomes anti-parallel (AP state) with respect to the magnetic orientation of the pin layer P. As a result, the MTJ element 11a goes into the high-resistance state (data "1"). When a current flows in the direction of arrow A2 in a write operation, the magnetic orientation of the free layer F becomes parallel (P state) with respect to the magnetic orientation of the pin layer P. As a result, the MTJ element 11a goes into the low-resistance state (data "0"). In this manner, different data can be written in the MTJ element depending on the direction in which a current flows.

<1-1-4> Configuration of Delay Controller

Figure 4:
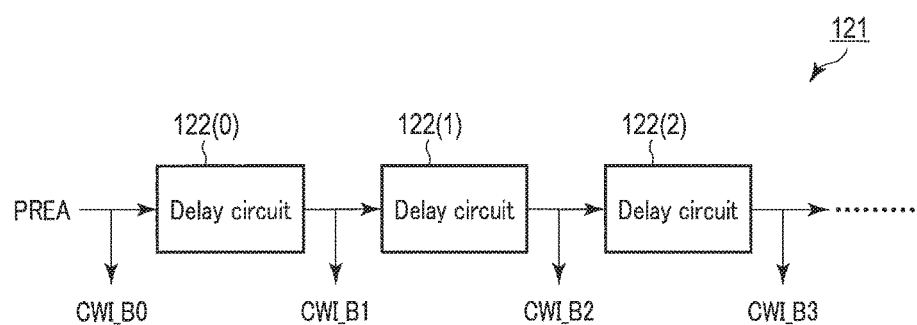
FIG. 4 shows a delay controller of the memory system according to the first embodiment.

The delay controller 121 will be described with reference to FIG. 4. The delay controller 121 includes a plurality of delay circuits 122 (0)-(z) (z is a natural number) each of which delays an input command by period tPPDI. The delay circuits 122(0)-(z) are each associated with a predetermined block. Namely, delay circuit 122 (x (x: integer)) is associated with bank group 130 (BGa (a: integer)) and bank 10 (BKb (b: integer)). The output signal of delay circuit 122 (x) is supplied to bank group 130 (BGa) and bank 10(BKb).

Upon receipt of, for example, pre-charge all bank command PREA, the delay controller 121 generates command CWI_B0. Then, the delay controller 121 generates command CWI_B1 by delaying command CWI_B0 by period tPPDI via delay circuit 122 (0). In addition, delay circuit 122 (1) generates command CWI_B2 by delaying the command received from delay circuit 122 (0) by period tPPDI. Similarly, a plurality of delay circuits 122 (0)-(z) are connected in series so that a command is generated every period tPPDI. When delay circuits 122 (0)-(z) are not distinguished from one another, they will be merely referred to as "delay circuit 122". The configuration of the delay controller 121 is not limited to this, and may be changed as appropriate. When commands CWI_B0 to CWI_Bz are not distinguished from one another, they will be merely referred to as "command CWI". The command CWI is a command generated by the internal controller 120.

<1-2> Operation

<1-2-1> Basic Command Sequence

A basic command sequence relating to the write operation of the memory system according to the present embodiment will be described with reference to FIG. 5.

[Time T0]

The memory controller 200 issues an active command ACT. Upon receipt of the active command ACT, the semiconductor storage device 100 transitions to the active state. For example, when receiving the active command ACT, the semiconductor storage device 100 receives a bank group address, a bank address, and a row address from the memory controller 200. Then, the bank group address, bank address, and row address are set.

[Time T1]

At time T1, after the elapse of period tRCD (RAS to CAS delay) from time T0, the memory controller 200 issues a write command WT.

The semiconductor storage device 100 receives the write command WT from the memory controller 200 subsequently to the active command ACT.

By the write command WT being input, a page buffer access operation is designated.

In a write operation, a bank group address, a bank address, and a column address are input from the memory controller 200, and then set in the command address circuit 110.

Period tRCD (RAS to CAS delay) in the figure is a period from receipt of the active command ACT to receipt of the write command WT. "RAS" stands for "row address strobe" and "CAS" stands for "column address strobe".

[Time T2]

At time T2, which is write latency WL after time T1, the memory controller 200 outputs data Din to the semiconductor storage device 100 via data line DQ. The write latency WL is a time period from a time when the memory controller 200 inputs a write command WT to a time when the memory controller 200 boots a data strobe DQS (not shown) to output write data to data line DQ. Period BL/2 (BL: Burst Length) in the figure is a period required for transmission/reception of data Din.

[Time T3]

When the memory controller 200 completes outputting data Din, the semiconductor storage device 100 stores received data Din in the page buffer 13. Such an operation of storing data in the page buffer 13 is called a "page buffer access operation" (also called a "PB access").

[Time T4 to Time T5]

The memory controller 200 can issue a pre-charge command PRE from time T3 to time T4, which is after the elapse of period tWR from time T3. Period tWR is a period required for the page buffer access operation. Namely, period tWR is a period from issuance of a write command to completion of an access to the target page buffer.

The semiconductor storage device 100 receives a pre-charge command PRE, a bank group address, and a bank address from the memory controller 200. The bank group address and the bank address are set in the command address circuit 110.

Upon receipt of the pre-charge command PRE, the semiconductor storage device 100 starts a write operation of writing data stored in the page buffer 13 in the memory cell array 11 for the target bank in accordance with the internal command CWI issued by the internal controller 120.

Upon completion of the operation of writing data in the memory cell array 11, the semiconductor storage device 100 then starts a pre-charge operation (also called as "reset" or "bank reset") of word lines and bit lines. After time T5, which is after the elapse of period tRP from time T4, the memory controller 200 is enabled to issue an active command ACT to the same Bank. The memory controller 200 transmits a command or data in synchronization with the timing of the clock signal CLK.

When receiving the pre-charge command PRE, the semiconductor storage device 100 according to the present embodiment performs a write operation and a pre-charge operation. When receiving the write command WT, the semiconductor storage device 100 performs a page buffer access operation, but does not perform a write operation. To write data in the memory cell array 11, the memory controller 200 needs to issue a pre-charge command PRE. Namely, in the memory system 1 according to the present embodiment, the timing of the write operation to the memory cell is defined by the pre-charge command PRE, not the write command WT.

<1-2-2> Specific Example

A specific operational example of the case where the memory system 1 according to the present embodiment performs a write operation to all the banks 10 (eight in total) will be described with reference to FIG. 6.

[Time T10]

The memory controller 200 can issue a write command WT (1st to 8th WT) in order at intervals of period tCCD (CAS to CAS delay) for bank 10 (BK0) of bank group 130 (BG0), bank 10 (BK0) of bank group 130 (BG1), bank 10 (BK1) of bank group 130 (BG0), bank 10 (BK1) of bank group 130 (BG1), bank 10 (BK2) of bank group 130 (BG0), bank 10 (BK2) of bank group 130 (BG1), bank 10 (BK3) of bank group 130 (BG0), and bank 10 (BK3) of bank group 130(BG1).

Period tCCD (CAS to CAS delay) in the figure is a delay time from issuance of a write command WT to the issuance of the next write command WT.

[Time T12]

At time T2, after the elapse of period WL+BL/2+tWR from time T11a, at which write command WT (8th WT) is issued, the memory controller 200 issues a pre-charge all bank command PREA, which is an instruction to perform write and pre-charge operations to all the banks 10 of the semiconductor storage device 100.

An operation of the semiconductor storage device 100 performed when the pre-charge all bank command PREA is received will be described with reference to FIG. 7.

[Time T12a]

Upon receipt of the pre-charge all bank command PREA, the delay controller 121 generates a command CWI_B0 to CWI_B7 every period tPPDI.

The internal controller 120 issues, for bank group 130 (BG0), the addresses of bank group 130 (BG0) and bank 10 (BK0), and command CWI_B0.

Upon receipt of command CWI_B0 and the address of bank 10 (BK0), bank group 130 (BG0) performs a data write operation to bank 10 (BK0).

[Time T12b]

At time T12b, after the elapse of period tPPDI from time T12a, the internal controller 120 issues, for bank group 130 (BG1), the addresses of bank group 130 (BG1) and bank 10 (BK0), and command CWI_B1.

Upon receipt of command CWI_B1 and the address of bank 10 (BK0), bank group 130 (BG1) performs a data write operation to bank 10 (BK0).

[Time T12c]

At time T12c, after the elapse of period tPPDI from time T12b, the internal controller 120 issues, for bank group 130 (BG0), the addresses of bank group 130 (BG0) and bank 10 (BK1), and command CWI_B2.

Upon receipt of command CWI_B2 and the address of bank 10 (BK1), bank group 130 (BG0) performs a data write operation to bank 10 (BK1).

[Time T12e]

At time T12e, after the elapse of period tPPDI from time T12c, the internal controller 120 issues, for bank group 130 (BG1), the addresses of bank group 130 (BG1) and bank 10 (BK1), and command CWI_B3.

Upon receipt of command CWI_B3 and the address of bank 10 (BK1), bank group 130 (BG1) performs a data write operation to bank 10 (BK1).

[Time T12f]

At time T12f, after the elapse of period tPPDI from time T12e, the internal controller 120 issues, for bank group 130 (BG0), the addresses of bank group 130 (BG0) and bank 10 (BK2), and command CWI_B4.

Upon receipt of command CWI_B4 and the address of bank 10 (BK2), bank group 130 (BG0) performs a data write operation to bank 10 (BK2).

[Time T12g]

At time T12g, after the elapse of period tPPDI from time T12f, the internal controller 120 issues, for bank group 130(BG1), the addresses of bank group 130 (BG1) and bank 10 (BK2), and command CWI_B5.

Upon receipt of command CWI_B5 and the address of bank 10 (BK2), bank group 130 (BG1) performs a data write operation to bank 10 (BK2).

[Time T12h]

At time T12h, after the elapse of period tPPDI from time T12g, the internal controller 120 issues, for bank group 130 (BG0), the addresses of bank group 130 (BG0) and bank 10 (BK3), and command CWI_B6.

Upon receipt of command CWI_B6 and the address of bank 10 (BK3), bank group 130 (BG0) performs a data write operation to bank 10 (BK3).

[Time T12i]

At time T12i, after the elapse of period tPPDI from time T12h, the internal controller 120 issues, for bank group 130 (BG1), the addresses of bank group 130 (BG1) and bank 10 (BK3), and command CWI_B7.

Upon receipt of command CWI_B7 and the address of bank 10 (BK3), bank group 130 (BG1) performs a data write operation to bank 10 (BK3).

The order of issuing a command for the banks is not limited to the above.

Figure 7:
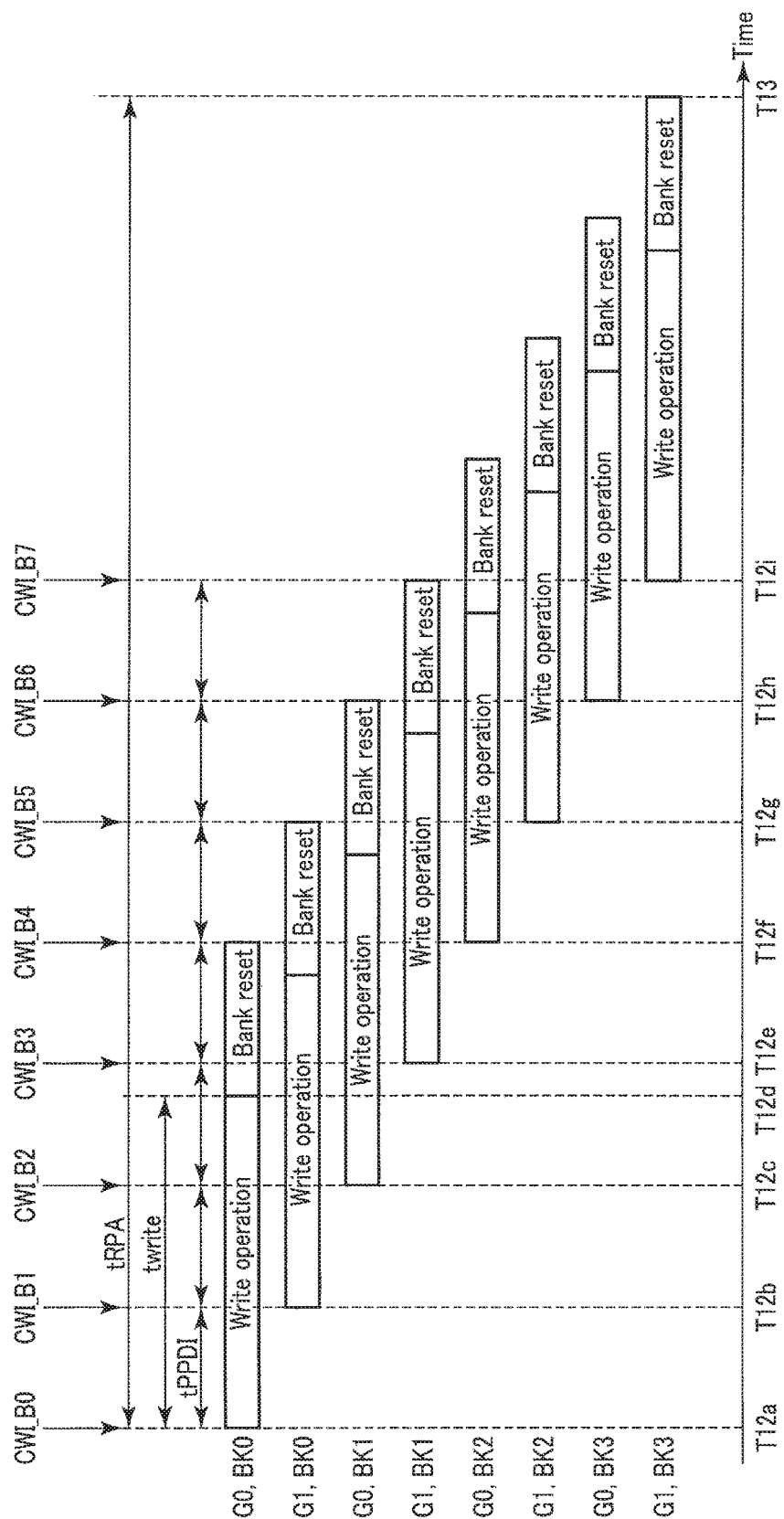
FIG. 7 shows an operation relating to FIG. 6 of a semiconductor storage device of the memory system according to the first embodiment.

As shown in FIG. 7, the time required for a write operation to the memory cell is "twrite". The write operation is performed in page size units. Namely, in the present embodiment, the number of cells to which write operations are simultaneously performed is defined by "(twrite/tPPDI) *page size". In the present embodiment, as shown in FIG. 7, time T12c-time T12e, the delay period tPPDI is set so that the number of the banks to which write operations are simultaneously performed is, for example, not more than three. Period tPPDI may be changed as appropriate.

After time T13, which is after the elapse of period tRPA from time T12 (after completion of the write operation), the memory controller 200 can issue an active command ACT. Namely, the memory controller 200 cannot issue an active command ACT until period tRPA has elapsed from issuance of the pre-charge all bank command PREA. Period tRPA can be defined by "tPPDI*(the number of bank groups*the number of bank addresses−1)+tRP".

<1-3> Advantage

According to the above-described embodiment, the semiconductor storage device 100 loads externally-transferred data to the page buffer in response to a write command WT issued by the memory controller 200. The semiconductor storage device 100 writes data held in the page buffer 13 into the memory cell array 11 in response to a pre-charge command PRE. The semiconductor storage device 100 does not simultaneously perform a write operation to all the banks 10 even when it receives a pre-charge all bank command PREA, which is an instruction to perform write and pre-charge operations to all the banks 10, from the memory controller 200. Namely, the semiconductor storage device 100 inhibits, by the delay controller 121, a write operation from being simultaneously performed to all the banks 10 when the pre-charge all bank command PREA is issued.

To facilitate understanding of the advantage, a memory system according to a comparative example of the first embodiment will be described.

Figure 9:
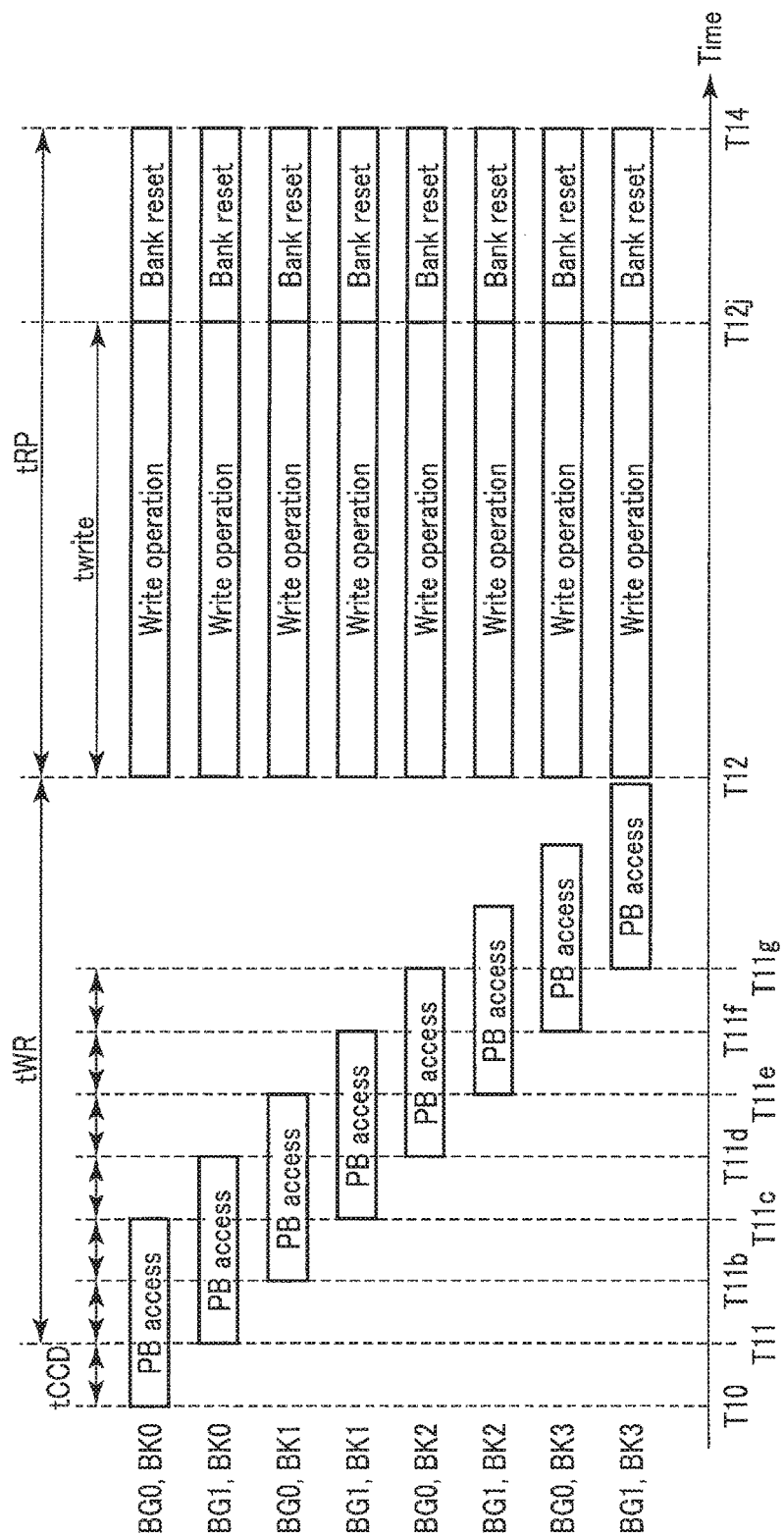
FIG. 9 shows an operation relating to FIG. 8 of a semiconductor storage device of the memory system according to the comparative example of the first embodiment.

The semiconductor storage device 100 according to the comparative example does not include the delay controller 121. As shown in FIG. 8, at time T12, upon receipt of a pre-charge all bank command PREA from the memory controller 200, the semiconductor storage device 100 performs a write operation to all the banks 10 (tRP<tRPA). As shown in FIG. 9, a write operation is simultaneously performed to all the banks 10. In this case, the number of cells to which write operations are simultaneously performed is "page size*bank group number*bank address number", with the result that the power consumption of the semiconductor storage device 100 from time T12 to time T12j is high.

As a result, data may not be correctly written for due to insufficient power necessary for data writing. In this example, the number of banks 10 is eight. However, if the number of banks 10 increases, such possibility further increases.

The present embodiment can control the timing of writing data in the memory cell for each bank 10 by using the delay controller 121 when a pre-charge all bank command PREA is issued from the memory controller 200. Accordingly, unlike the comparative example, the present embodiment can prevent a write operation from being simultaneously performed to all the banks 10, and inhibit the problem of insufficient power necessary for the write operation.

According to the above-described embodiment, the data transfer from the memory controller 200 to the semiconductor storage device 100 is independent from the data write operation in the semiconductor storage device 100. Therefore, the peak of the current incident to the write operations to the memory cells can be suppressed without decreasing the data transfer rate to the semiconductor storage device 100. As a result, a semiconductor storage device 100 of high reliability and quality can be provided.

In the above-described embodiment, the case where a write operation is performed to one bank 10 every period tPPDI has been described. However, write operations to a plurality of banks 10 may be performed every period tPPDI, for example. The write operations may be sequentially performed in the unit of sub-banks which are divisions of one bank.

<2> Second Embodiment

The second embodiment will be described. In the first embodiment, the semiconductor storage device controls data write timing. In the second embodiment, however, the memory controller controls command issuance timing. Descriptions of parts similar to those of the first embodiment will be omitted. The semiconductor storage device 100 according to the second embodiment may adopt the delay controller 121.

<2-1> Operation

A data write operation of the memory system 1 of the present embodiment will be described with reference to FIG. 10. The memory controller 200 may issue a pre-charge command for a predetermined bank 10 in a predetermined bank group every period tPPD.

Figure 10:
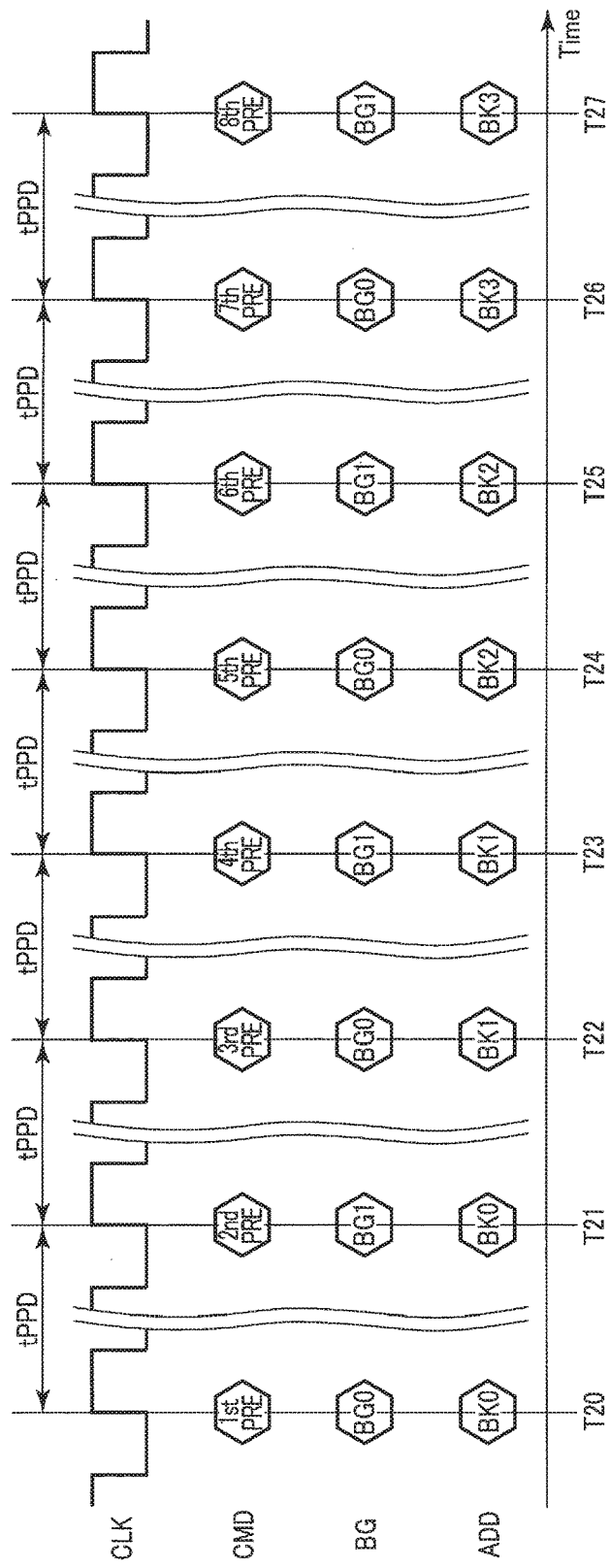
FIG. 10 is a command sequence showing a write operation of a memory system according to the second embodiment.

Specifically, as shown in FIG. 10, the memory controller 200 issues, at time T20, a pre-charge command PRE (1st PRE in the figure) for bank group 130 (BG0), bank 10 (BK0).

At time T21, after the elapse of period tPPD from time T20, the memory controller 200 then issues a pre-charge command PRE (2nd PRE in the figure) for bank group 130 (BG1), bank 10 (BK0).

At time T22, after the elapse of period tPPD from time T21, the memory controller 200 also issues a pre-charge command PRE (3rd PRE in the figure) for bank group 130 (BG0), bank 10 (BK1).

At time T23, after the elapse of period tPPD from time T22, the memory controller 200 then issues a pre-charge command PRE (4th PRE in the figure) for bank group 130 (BG1), bank 10 (BK1).

At time T24, after the elapse of period tPPD from time T23, the memory controller 200 also issues a pre-charge command PRE (5th PRE in the figure) for bank group 130 (BG0), bank 10 (BK2).

At time T25, after the elapse of period tPPD from time T24, the memory controller 200 then issues a pre-charge command PRE (6th PRE in the figure) for bank group 130 (BG1), bank 10 (BK2).

At time T26, after the elapse of period tPPD from time T25, the memory controller 200 also issues a pre-charge command PRE (7th PRE in the figure) for bank group 130 (BG0), bank 10 (BK3).

At time T27, after the elapse of period tPPD from time T26, the memory controller 200 then issues a pre-charge command PRE (8th PRE in the figure) for bank group 130 (BG1), bank 10 (BK3).

Figure 11:
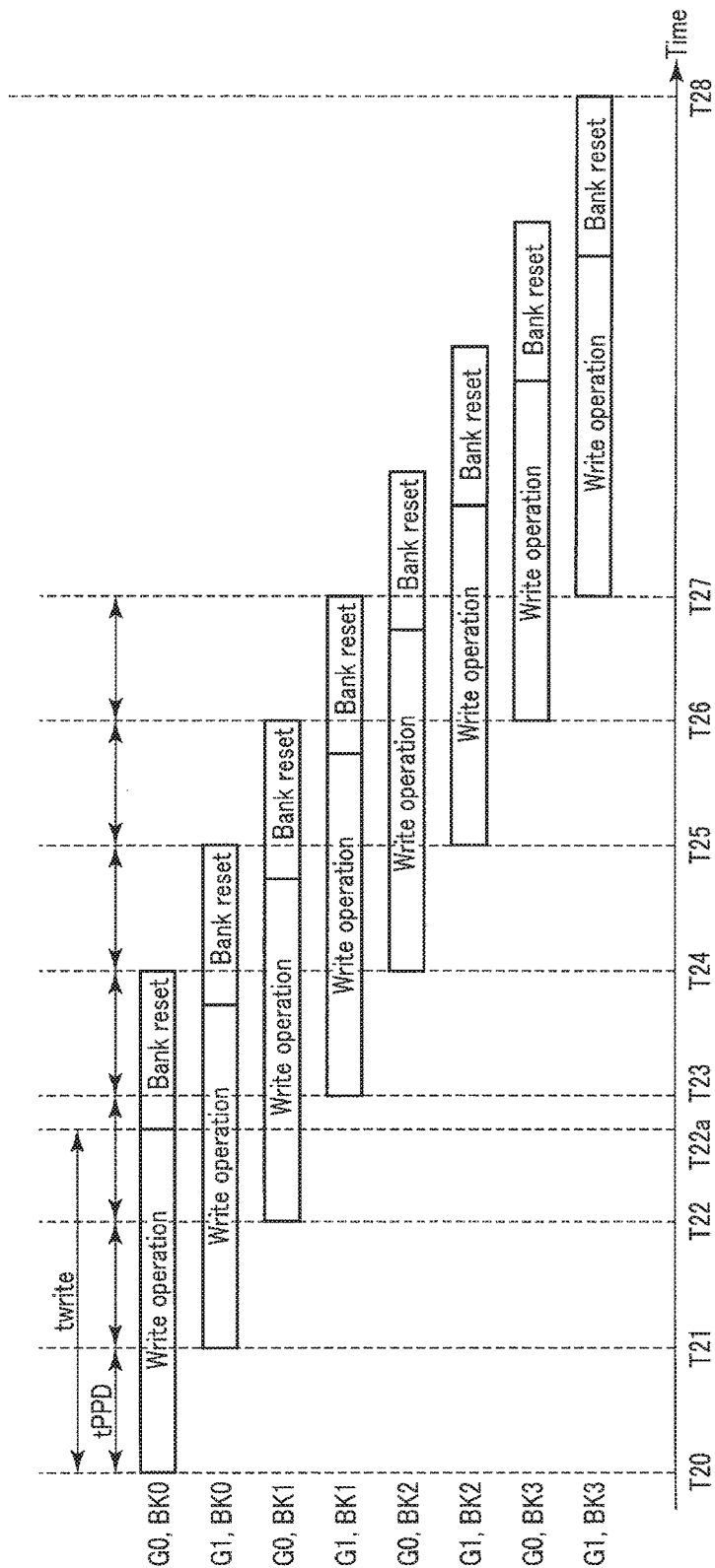
FIG. 11 shows an operation relating to FIG. 10 of a semiconductor storage device of the memory system according to the second embodiment.

As shown in FIG. 11, upon receipt of pre-charge command 1st PRE from the memory controller 200, bank group 130 (BG0) performs a data write operation to the memory cell of bank 10 (BK0). Similarly, the semiconductor storage device 100 receives a pre-charge command at intervals of period tPPD, and performs a write operation to the memory cell of a bank 10 based on the address.

The number of cells to which write operations are simultaneously performed is defined by "(twrite/tPPD)*page size".

<2-2> Advantage

According to the above-described embodiment, upon receipt of a pre-charge command, the semiconductor storage device 100 performs a write operation to a memory cell. The memory controller 200 can control the number of cells to which write operations are simultaneously performed by controlling period tPPD.

To facilitate understanding of the advantage, a memory system according to a comparative example of the second embodiment will be described.

As shown in FIG. 12, upon receipt of a write command WT, the semiconductor storage device according to the comparative example successively performs a page buffer access operation and a data write operation.

According to the DDR4 SDRAM specification, when a write command is successively issued for the same bank group, standing by for period tCCD_L is required. When a write command is issued for different bank groups successively, standing by for period tCCD_S (tCCD_S<tCCD_L) is required.

Those periods tCCD_S and tCCD_L may be shorter than the data write period twrite. For example, the DRAM's data write period twrite is approximately equal to or shorter than tCCD_S and tCCD_L. However, the MRAM's data write period twrite may be longer than the DRAM's data write period twrite.

Figure 14:
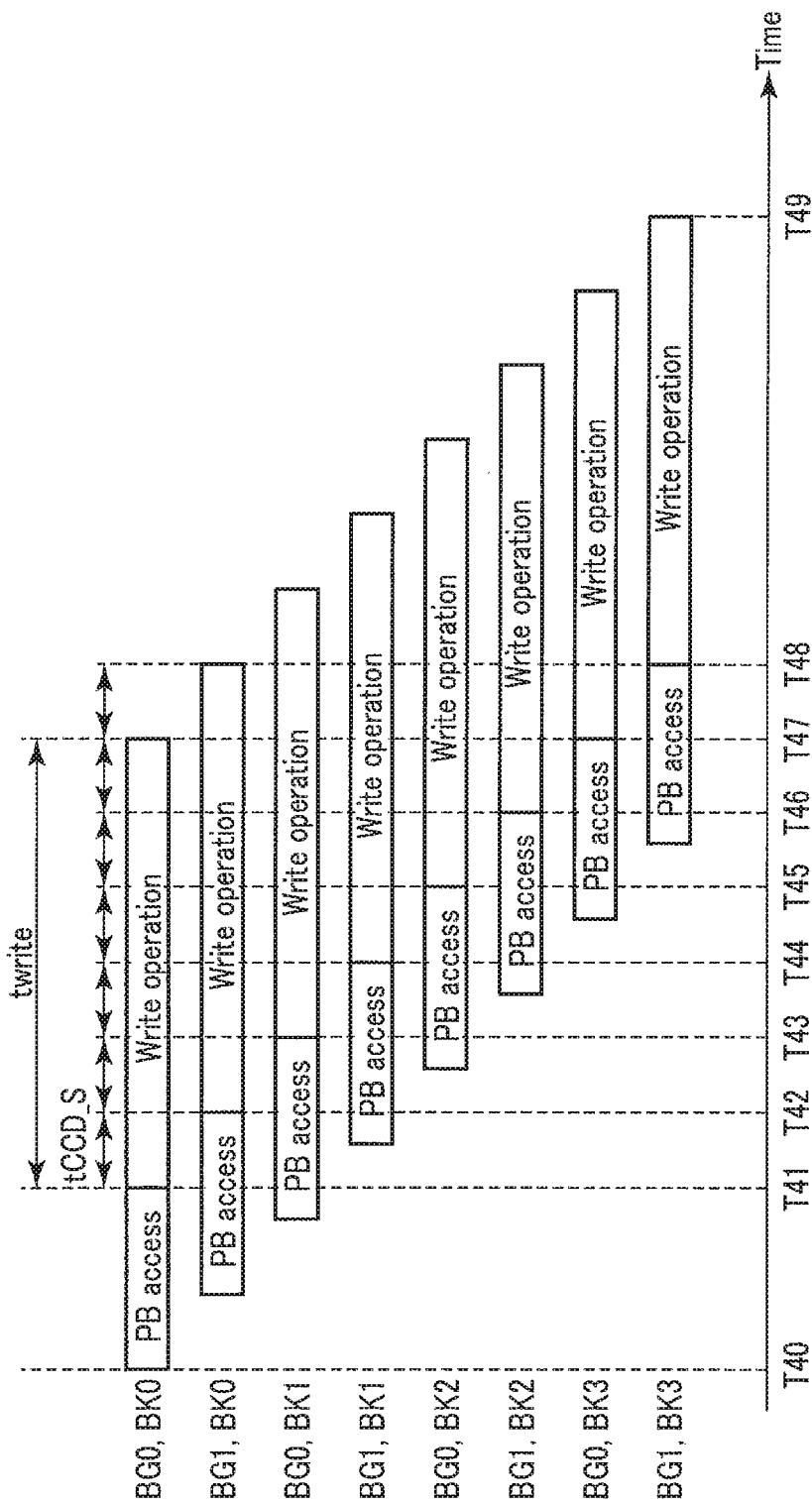
FIG. 14 shows an operation relating to FIG. 13 of a semiconductor storage device of the memory system according to the comparative example of the second embodiment.

When a write command is input at intervals of period tCCD_S from time T30 to time T37 as shown in FIG. 13, the semiconductor storage device 100 performs a page buffer access operation and a data write operation at intervals of period tCCD_S from time T40 to time T49 as shown in FIG. 14. Therefore, the number of cells to which write operations are simultaneously performed is defined by "(twrite/tCCD_S)*page size". As mentioned above, the minimum values of periods tCCD_S and tCCD_L are fixed under the specification, so the number of cells to which write operations are simultaneously performed depends on period twrite. If period twrite becomes longer, the power consumption increases. As a result, data may not be correctly written due to insufficient power necessary for writing.

In the above-described second embodiment, the memory controller 200 needs to issue a pre-charge command PRE to write data into the memory cell array 11. Namely, in the memory system 1 according to the present embodiment, the timing of the write operation to the cell is defined by the pre-charge command PRE, not the write command WT.

In addition, the memory controller 200 issues a pre-charge command at intervals of period tPPD or longer in the present embodiment. Namely, the memory controller 200 can control the number of cells to which write operations are simultaneously performed by controlling period tPPD. This enables control of the power consumption at the time of writing.

According to the above-described embodiment, the data transfer from the memory controller 200 to the semiconductor storage device 100 is independent from the data write operation in the semiconductor storage device 100. Therefore, the peak of the current incident to the write operations to the memory cells can be suppressed without decreasing the data transfer rate to the semiconductor storage device 100. As a result, a semiconductor storage device 100 of high reliability and quality can be provided.

The present embodiment may be combined with the first embodiment.

<3> Third Embodiment

The third embodiment will be described. Described in the third embodiment is the case where the memory controller controls the command issuance timing based on a pre-charge window. Descriptions of parts similar to those of the first or second embodiment will be omitted.

<3-1> Operation

A data write operation of the memory system 1 of the present embodiment will be described with reference to FIG. 15. The memory controller 200 can issue a pre-charge command up to the pre-charge command upper limit number Nwt of times during period tPRW.

The memory controller 200 adopts tPRW and Nwt that satisfy "tPRW/(Nwt−1)<tCCD (including tCCD_S and tCCD_L)". In the present embodiment, tPRW and Nwt are set to satisfy the constraints "tPRW≥twrite" and "pre-charge command upper limit number Nwt≤3". However, the above-mentioned constraints are merely examples, and period tPRW and pre-charge command upper limit number Nwt may be changed as appropriate.

Figure 15:
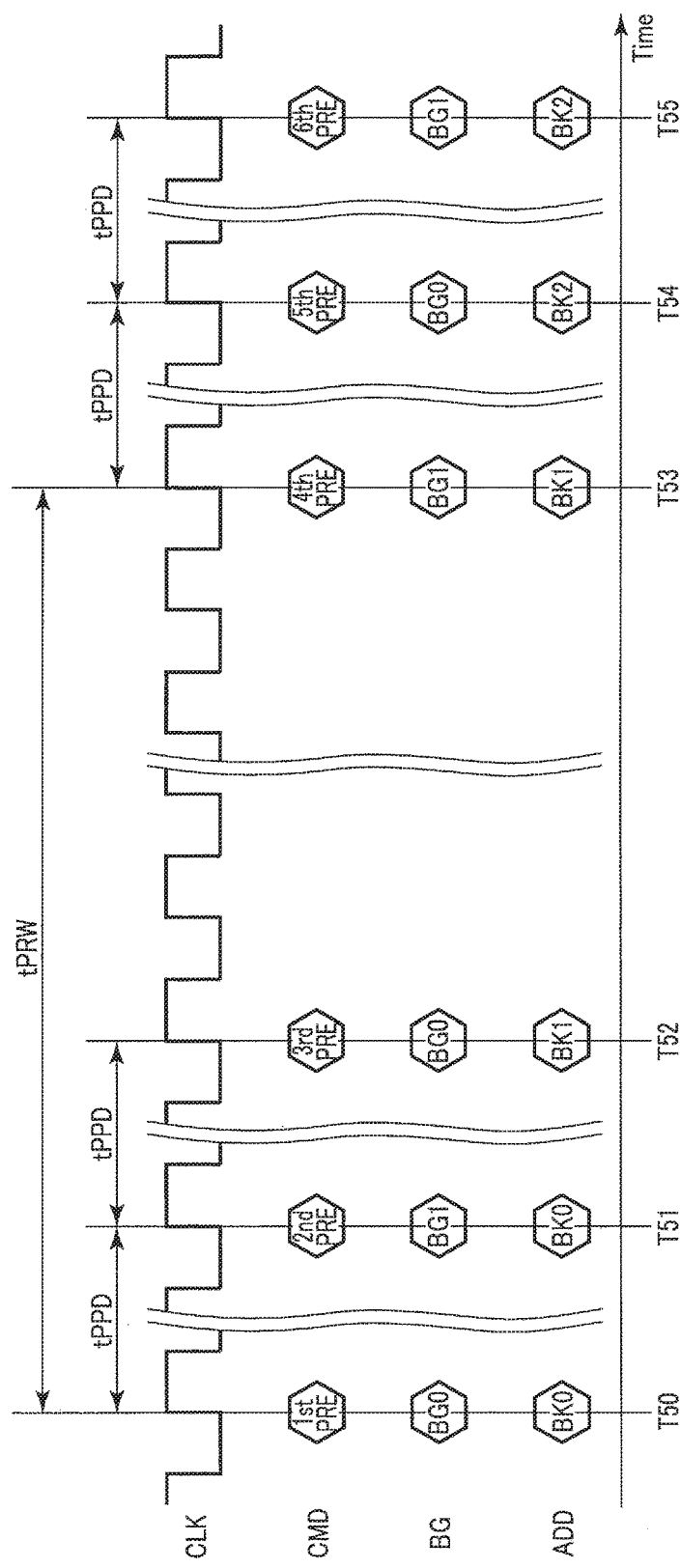
FIG. 15 is a command sequence showing a specific example of a write operation of a memory system according to the third embodiment.

Specifically, as shown in FIGS. 15 and 16, the memory controller 200 issues, at time T50, a pre-charge command PRE (1st PRE in the figure) for bank group 130 (BG0), bank 10 (BK0). If the memory controller 200 issues a pre-charge command PRE (1st PRE in the figure) at time T50, it can further issue a pre-charge command twice for period tPRW from time T50.

Upon receipt of pre-charge command 1st PRE, the bank group 130 (BG0) performs a data write operation to the memory cell of bank 10 (BK0).

At time T51, after the elapse of period tPPD from time T50, the memory controller 200 issues a pre-charge command PRE (2nd PRE in the figure) for bank group 130 (BG1), bank 10 (BK0). In the present embodiment, the case where period tPPD is provided is described as an example. However, period tPPD is not necessarily provided.

Upon receipt of pre-charge command 2nd PRE, bank group 130 (BG1) performs a data write operation to the memory cell of bank 10 (BK0).

At time T52, after the elapse of period tPPD from time T51, the memory controller 200 issues a pre-charge command PRE (3rd PRE in the figure) for bank group 130 (BG0), bank 10 (BK1).

Upon receipt of pre-charge command 3rd PRE, bank group 130 (BG0) performs a data write operation to the memory cell of bank 10 (BK1).

Since the memory controller 200 has issued a pre-charge command three times from time T50 to time T52, it cannot issue a new pre-charge command for period tPRW from time T50.

At time T53, after the elapse of period tPRW from time T50, the memory controller 200 can issue a pre-charge command PRE (4th PRE in the figure) for bank group 130 (BG1), bank 10 (BK1). After the memory controller 200 issues a pre-charge command PRE (4th PRE in the figure) at time T53, it can issue a new pre-charge command period tPRW after time T51. Similarly, the memory controller 200 repeats the operations described regarding time T50 to time T53.

<3-2> Advantage

According to the above-described embodiment, upon receipt of a pre-charge command, the semiconductor storage device 100 performs a write operation. The memory controller 200 can control the number of cells to which write operations are simultaneously performed by controlling period tPRW. Namely, in the present embodiment, the memory controller 200 can limit the maximum number of cells to which write operations are performed. This enables control of the power consumption at the time of writing. As a result, a semiconductor storage device of high quality can be provided.

The present embodiment may be combined with the first and second embodiments.

<4> Fourth Embodiment

The fourth embodiment will be described. Described in the fourth embodiment is the case where a command for performing a write operation is added. Descriptions of parts similar to those of the first embodiment will be omitted. The semiconductor storage device 100 according to the fourth embodiment need not include the delay controller 121.

<4-1> Command Sequence

A basic command sequence relating to the write operation of the memory system according to the present embodiment will be described with reference to FIG. 17.

[Time T0 to Time T3]

The operations are the same as those described regarding FIG. 5.

[Time T4 to Time T8]

The memory controller 200 can issue a cell write command CW at time T4, after the elapse of period tWR from time T3.

The semiconductor storage device 100 receives a cell write command CW, a bank group address, and a bank address from the memory controller 200. The bank group address and the bank address are set in an address buffer (not shown).

Upon receipt of the cell write command CW, the internal controller 120 starts a write operation to write data stored in the page buffer 13 into the bank designated by the bank group address and the bank address.

[Time T8 to Time T9]

The memory controller 200 can issue a pre-charge command PRE at time TS, after the elapse of period tCW from time T4.

Upon receipt of the pre-charge command PRE, the semiconductor storage device 100 starts a bank reset operation. After time T9, after the elapse of period tRP from time T8, the memory controller 200 is enabled to issue an active command ACT to the same bank.

Upon receipt of a cell write command CW, the semiconductor storage device 100 according to the present embodiment performs a data write operation to the memory cell.

The cell write command CW may be replaced with the pre-charge command in the above-described first to third embodiments.

The present embodiment may be combined with the first to third embodiments.

<4-2> Modification of Fourth Embodiment

Next, a modification of the fourth embodiment will be described with reference to FIG. 18.

<4-3> Summary of Modification of Fourth Embodiment

Even when the cell write command CW is issued for a bank, a write command WT may not have been issued for the bank. It is not preferable to perform a data write operation to such a bank from the viewpoint of power consumption.

In the modification of the fourth embodiment, the cell write command CW is issued only for the bank for which the write command WT has been issued. Hereinafter, a configuration for implementing the modification of the fourth embodiment will be described.

<4-4> Internal Controller According to Modification of Fourth Embodiment

The internal controller 120 according to the modification of the fourth embodiment includes AND operation circuits 123 (0)-(z). The AND operation circuits 123 (0)-(z) are each associated with a predetermined block. Namely, AND operation circuit 123 (x) is associated with bank group 130 (BGa), bank 10 (BKb). Accordingly, the output signal of AND operation circuit 123 (x) is supplied to bank group 130 (BGa), bank 10 (BKb).

AND operation circuit 123 (x) receives cell write command CW_Bx at its first input terminal, and receives flag WFLAG_Bx at its second input terminal. Then, AND operation circuit 125 (x) outputs an operation of the signals input from the first input terminal and the second input terminal as cell write command CWI_Bx.

Cell write command CWI_Bx is the same as the cell write command CW described in the fourth embodiment. In the present modification, the cell write command CW for bank group 130 (BGa), bank 10 (BKb) is referred to as cell write command CW_Bx.

Flag WFLAG_Bx is generated by the internal controller 120. Specifically, when the internal controller 120 determines that a write command WT is input after a previous pre-charge operation is performed for a target bank (e.g., bank group 130 (BGa), bank 10 (BKb)), the internal controller 120 brings flag WFLAG_Bx to a high (H) level. Unless a write command WT is input after the previous pre-charge operation is performed for the target bank, the internal controller 120 brings keeps flag WFLAG_Bx at a low (L) level.

AND operation circuit 123 (x) outputs cell write command CWI_Bx when a cell write command CW is in receipt and flag WFLAG_Bx is at the H level. Namely, AND operation circuit 123 (x) issues cell write command CWI_Bx only when a write command WT is in receipt for the target bank. The other AND operation circuits 123 operate in the same manner.

Cell write command CWI_Bx is the same as the cell write command CW described in the fourth embodiment. Upon receipt of cell write command CWI_Bx, bank group 130 (BGa) starts a write operation to write data stored in the page buffer 13 into the memory cell array 11 for bank 10 (BKb).

The memory controller 200 can issue a pre-charge command PRE after the elapse of period tCW from issuance of cell write command CWI_Bx.

<4-5> Advantage

According to the above-described embodiment, the cell write command CW is issued only for the bank for which the write command WT has been issued. If a write command WT has not been issued for a bank, a data write operation is not performed to the bank. Therefore, an unnecessary write operation can be inhibited. As a result, power consumption can be reduced.

<5> Fifth Embodiment

The fifth embodiment will be described. Described in the fifth embodiment is the case where, when the semiconductor storage device receives a pre-charge all bank command, a cell write command is issued as needed. Descriptions of parts similar to those of the first or fourth embodiment or the modification of the fourth embodiment will be omitted.

<5-1> Summary of Fifth Embodiment

The summary of the fifth embodiment will be described. In the first embodiment, when a pre-charge all bank command PREA is issued, a write operation is performed for the banks including banks for which a write command WT has not been issued. In the fifth embodiment, when a pre-charge all bank command PREA is issued, a write operation is performed only for the banks for which a write command WT has been issued.

Hereinafter, a configuration necessary for implementing the fifth embodiment will be described.

<5-2> Configuration of Delay Controller

The delay controller 121 of the semiconductor storage device according to the fifth embodiment will be described with reference to FIG. 19. As shown in FIG. 19, the delay controller 121 includes a plurality of delay circuits 122 (0)-(z). In addition, the delay controller 121 includes delay circuits 124 (0)-(z) which delay output signals of delay circuits 122 (0)-(z) by period tPPDI. Moreover, the delay controller 121 includes AND operation circuits 125 (0)-(z) which receive the output signals of delay circuits 122 (0)-(z).

For example, delay circuit 122 (x), delay circuit 124 (x) and AND operation circuit 125 (x) are associated with bank group 130 (BGa), bank 10 (BKb). Namely, the output signals of delay circuit 124 (x) and AND operation circuit 125 (x) are supplied to bank group 130 (BGa), bank 10 (BKb).

AND operation circuit 125 (x) receives command PREA or the output signal of delay circuit 122 (x) at its first input terminal, and receives flag WFLAG_Bx at its second input terminal. Then, AND operation circuit (x) outputs an operation of the signals input from the first input terminal and the second input terminal as cell write command CWI_Bx. Flag WFLAG_Bx is the same as that described in the modification of the fourth embodiment.

AND operation circuit 125 (x) outputs cell write command CWI_Bx when command PREA or the output signal of delay circuit 122 (x) is at the H level, and flag WFLAG_Bx is at the H level. Namely, AND operation circuit 125 (x) issues cell write command CWI_Bx only when a pre-charge all bank command PREA is in receipt, and a write command WT has been input for the target bank.

The other delay circuits 122 and 124 and AND operation circuits 125 operate in the same manner.

When the delay controller 121 issues cell write command CWI_Bx, it issues bank reset command PREI_Bx period twrite after the issuance of cell write command CWI_Bx. Therefore, the delay controller 121 operates in the same manner as described in the fourth embodiment. Even if cell write command CWI_Bx is not issued, command PREI_Bx is issued.

Upon receipt of the pre-charge all bank command PREA, the delay controller 121 selectively issues cell write command CWI_Bx, and issues command PREI_Bx every period tPPDI.

Upon receipt of command PREI_Bx, bank group 130 (BGa) performs a pre-charge operation of bank 10 (BKb).

<5-3> Advantage

In the semiconductor storage device according to the above-described embodiment, when a pre-charge all bank command PREA is issued, a write operation is performed only for the banks for which a write command WT has been issued. Therefore, unnecessary data write operations to memory cells can be inhibited. As a result, power consumption can be reduced.

<6> Sixth Embodiment

The sixth embodiment will be described. Described in the sixth embodiment is the case where the semiconductor storage device issues a cell write command as needed when the semiconductor storage device receives a pre-charge command. Descriptions of parts similar to those of the second or fourth embodiments or the modification of the fourth embodiment will be omitted.

<6-1> Summary of Sixth Embodiment

The summary of the sixth embodiment will be described. In the second embodiment, when a pre-charge command PREA is issued, a write operation is performed for the banks including banks for which a write command WT has been issued or not. In the sixth embodiment, when a pre-charge command PREA is issued, a write operation is performed only for the banks for which a write command WT has been issued.

Hereinafter, a configuration necessary for implementing the sixth embodiment will be described.

<6-2> Configuration of Delay Controller

Figure 20:
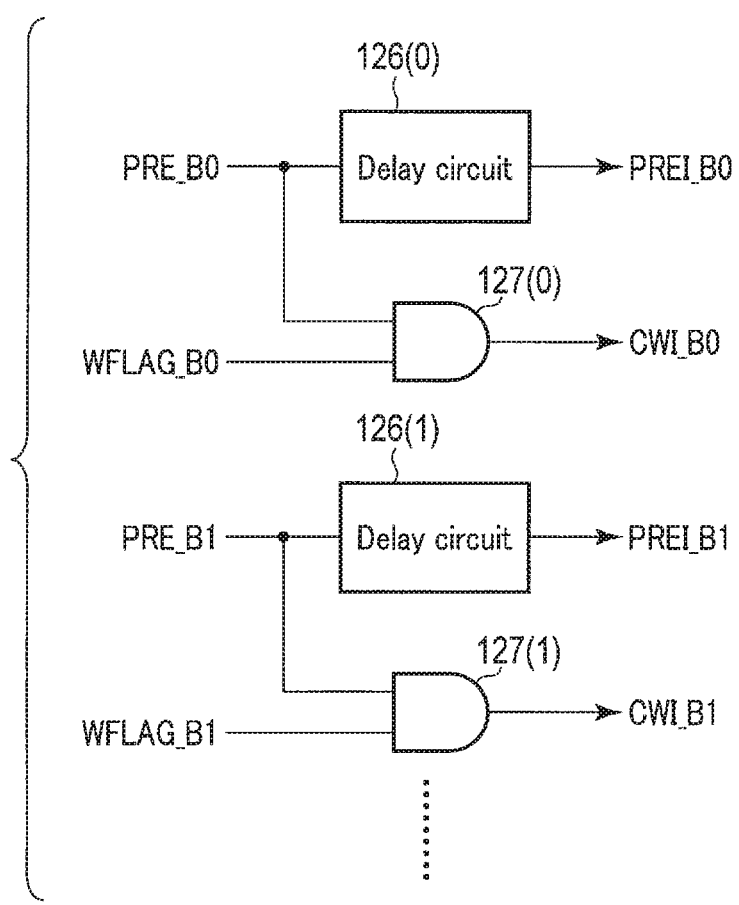
FIG. 20 shows a delay controller of a semiconductor storage device according to the sixth embodiment.

The delay controller 121 of the semiconductor storage device according to the sixth embodiment will be described with reference to FIG. 20. As shown in FIG. 20, the delay controller 121 includes a plurality of delay circuits 126 (0)-(z). Moreover, the delay controller 121 includes AND operation circuits 127 (0)-(z).

For example, delay circuit 126 (x) and AND operation circuit 127 (x) are associated with bank group 130 (BGa), bank 10 (BKb). Namely, the output signals of delay circuit 126 (x) and AND operation circuit 127 (x) are supplied to bank group 130 (BGa), bank 10 (BKb).

Delay circuit 126 (x) receives command PRE_Bx from the memory controller 200, and outputs command PREI_Bx delayed by period twrite.

AND operation circuit 127 (x) receives command PRE_Bx at its first input terminal, and receives flag WFLAG_Bx at its second input terminal. AND operation circuit 127 (x) outputs an operation of the signals input from the first input terminal and the second input terminal as cell write command CWI_Bx. Flag WFLAG_Bx is the same as that described in the modification of the fourth embodiment.

AND operation circuit 127 (x) outputs cell write command CWI_Bx when command PRE_Bx is in receipt, and flag WFLAG_Bx is at the H level. Namely, AND operation circuit 127 (x) issues cell write command CWI_Bx only when command PRE_Bx is in receipt, and a write command WT has been input for the target bank.

The other delay circuits 126 and AND operation circuits 127 operate in the same manner.

The delay controller 121 issues bank reset command PREI_Bx after the elapse of period twrite from the issuance of cell write command CWI_Bx. Therefore, the delay controller 121 operates in the same manner as described in the fourth embodiment. Even if cell write command CWI_Bx is not issued, bank reset command PREI_Bx is issued.

<6-3> Advantage

According to the above-described embodiment, the cell write command CW is issued only for the bank for which the write command WT has been issued. If a write command WT has not been issued for a bank, a data write operation is not performed to the bank. Therefore, an unnecessary write operation can be inhibited. As a result, power consumption can be reduced.

<7> Modifications, Etc

In the above-described embodiments, the MRAM may be an STT-MRAM (spin-transfer torque magnetoresistive random access memory) utilizing a spin transfer phenomenon for magnetization reversal of a magnetic layer.

In this description, the MRAM that stores data using a magnetic tunnel junction (MTJ) element as the variable resistive element has been described by way of example. However, the embodiments are not limited to this example.

For example, the embodiments are applicable to a semiconductor storage device that stores data utilizing a resistance change, for example, a resistance change type memory as well as the MRAM, such as a ReRAM (resistive random access memory) and a PCRAM (phase-change random access memory).

Furthermore, the embodiments are also applicable to a semiconductor storage device that stores data by a resistance change with an applied current or a applied voltage, or reads the stored data by converting a difference in resistance due to a resistance change to a current difference or a voltage difference.

In each of the above embodiments, as the variable resistive element of the memory cell, an MTJ element is explained as an example, but the variable resistive element is not limited thereto. Namely, the embodiments are applicable to any semiconductor storage device comprising a memory cell including an element that enables data storage (holding) or reading by utilizing changes of the electrical resistance caused by application of a current or voltage.

In each of the above embodiments, the bit line pair is referred to as a bit line BL and a source line SL for descriptive purposes. However, the bit line pair may be referred to as a first bit line and a second bit line, for example.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a memory device including a first bank that includes a first memory cell group and writes data into the first memory cell group upon receipt of a first command; and
a controller that issues a second command for the memory device to transfer data from the controller to the memory device, issues the first command for the memory device to write data into the first memory cell group, and issues a next first command after an interval of at least a first period,
wherein:
the memory device further includes a second bank that includes a second memory cell group and writes data into the second memory cell group upon receipt of the first command,
the controller issues the first command for the first bank or the second bank after the interval of at least the first period,
the first bank further includes a first buffer section,
upon receipt of the second command, the first bank holds data in the first buffer section,
upon receipt of the first command, the first bank writes data held in the first buffer section into the first memory cell group,
the second bank further includes a second buffer section,
upon receipt of the second command, the second bank holds data in the second buffer section, and
upon receipt of the first command, the second bank writes data held in the second buffer section into the second memory cell group.

2. The memory system of claim 1, wherein:
upon receipt of the first command, the first bank resets the first bank after writing data into the first memory cell group; and
upon receipt of the first command, the second bank resets the second bank after writing data into the second memory cell group.

3. The memory system of claim 1, wherein the first memory cell group and the second memory cell group include a resistance change element capable of holding data.

4. The memory system of claim 1, wherein the first memory cell group and the second memory cell group are one of a magnetoresistive random access memory (MRAM), a phase change random access memory (PCRAM), and a resistive random access memory (ReRAM).

5. A memory system comprising:
a memory device including a first bank that includes a first memory cell group and writes data into the first memory cell group upon receipt of a first command; and
a controller that issues a second command for the memory device to transfer data from the controller to the memory device, issues the first command for the memory device to write data into the first memory cell group, and limits a number of first commands issued during a first period,
wherein:
the memory device further includes a second bank that includes a second memory cell group and writes data into the second memory cell group upon receipt of the first command,
the first bank further includes a first buffer section,
upon receipt of the second command, the first bank holds data in the first buffer section,
upon receipt of the first command, the first bank writes data held in the first buffer section into the first memory cell group,
the second bank further includes a second buffer section,
upon receipt of the second command, the second bank holds data in the second buffer section, and
upon receipt of the first command, the second bank writes data held in the second buffer section into the second memory cell group.

6. The memory system of claim 5, wherein:
upon receipt of the first command, the first bank resets the first bank after writing data into the first memory cell group; and
upon receipt of the first command, the second bank resets the second bank after writing data into the second memory group.

* * * * *